United States Patent [19]
Lu et al.

[11] Patent Number: 5,773,830
[45] Date of Patent: Jun. 30, 1998

[54] CVD DIAMOND RADIATION DETECTOR

[75] Inventors: Grant Lu, Shrewsbury, Mass.; Gordon L. Cann, Laguna Beach, Calif.

[73] Assignee: Saint-Gobain/Norton Industrial Ceramics Corp., Worcester, Mass.

[21] Appl. No.: 447,390

[22] Filed: May 23, 1995

Related U.S. Application Data

[62] Division of Ser. No. 94,826, Jul. 20, 1993, abandoned.

[51] Int. Cl.$^6$ ................................................ G01T 1/24
[52] U.S. Cl. .................................................. 250/370.01
[58] Field of Search ........................... 250/336.1, 370.01

[56] References Cited

U.S. PATENT DOCUMENTS

| | | |
|---|---|---|
| 4,465,932 | 8/1984 | Burgemeister . |
| 4,833,328 | 5/1989 | Prins et al. ................ 250/370.01 |
| 5,075,096 | 12/1991 | Tanabe et al. . |
| 5,079,425 | 1/1992 | Imai et al. .................. 250/370.01 |
| 5,097,133 | 3/1992 | Nam et al. . |
| 5,128,546 | 7/1992 | Nam et al. . |
| 5,212,385 | 5/1993 | Jones ............................ 250/370.01 |
| 5,314,570 | 5/1994 | Ikegaya et al. . |
| 5,368,897 | 11/1994 | Kurihara et al. . |
| 5,418,018 | 5/1995 | Rudder et al. . |
| 5,527,565 | 6/1996 | Nam et al. ............... 250/370.01 X |

FOREIGN PATENT DOCUMENTS

| | | |
|---|---|---|
| 479625 A2 | 8/1992 | European Pat. Off. . |
| 493609 A1 | 8/1992 | European Pat. Off. . |
| 582397 A2 | 2/1994 | European Pat. Off. . |
| 638825 A2 | 2/1995 | European Pat. Off. . |
| WO 93/08927 | 5/1993 | WIPO . |

OTHER PUBLICATIONS

L. S. Pan, D. R. Kania, P. Pianetta, M. Landstrass, O. L. Landen and L. S. Plano, "Photoconductive Measurements on Microwave–Assisted Plasma–Enhanced CVD Diamond Films", Presented at Diamond Films '90, Sep. 17–19, 1990, Crans–Montana, Switzerland.

P. J. Fallon, T. L. Nam and R. J. Keddy, "Trapping levels in pulse–counting synthetic diamond detectors", Diamond and Related Materials, I (1992), pp. 1185–1189.

L. S. Pan, D. R. Kania, S. Han, J. W. Ager III, M. Landstrass, O. L. Landen and P. Pianetta, "Electrical Transport Properties of Undoped CVD Diamond Films", Science, vol. 255, Feb. 14, 1992, pp. 830–833.

D. R. Kania, M. I. Landstrass, M. A. Plano, L. S. Pan and S. Han, "Diamond Radiation Detectors", pp. 1–22 (no date).

L. S. Pan, S. Han, D. R. Kania, M. A. Plano, M. I. Landstrass, S. Zhao and H. Kagan, "Comparison of High Electrical Quality CVD Diamond and Natural Single–Crystal IIA Diamond", Presented at the 3rd Int'l Symp. on Diamond Materials, Honolulu, Hawaii, May 16–21, 1993, pp. 1–6.

M. A. Plano, M. I. Landstrass, L. S. Pan, S. Han, D. R. Kania, S. McWilliams and J. W. Ager III, "Polycrystalline CVD Diamond Films with High Electrical Mobility", Science, vol. 260, May 1993, pp. 1310–1312.

S. K. Kim, "Development of diamond radiation detectors for SSC and LHC", Nuclear Instruments & Method in Physics Research A315 (1992), pp. 39–42.

S. F. Kozlov, R. Stuck, M. Hage–Ali and P. Siffert, "Preparation and Characteristics of Natural Diamond Nuclear Radiation Detectors", IEEE Transactions on Nuclear Science, vol. NS–22, Feb. 1975.

(List continued on next page.)

Primary Examiner—Edward J. Glick
Attorney, Agent, or Firm—Volker R. Ulbrich

[57] ABSTRACT

The process is an arc jet CVD diamond deposition process with very low methane, less than 0.07%, and the addition of water. The resulting material has is characterized by a narrow Raman peak, a relatively large lattice constant, and a charge carrier collection distance of at least 25 microns.

6 Claims, 2 Drawing Sheets

OTHER PUBLICATIONS

L. S. Pan, D. R. Kania, P. Pianetta, O. L. Landen and M. Landstrass, "Intrinsic Photoconductivity in Polycrystalline CVD Diamond Films and In Natural and Synthetic Bulk Diamonds", Presented at the Second International Conference on the New Diamond Science and Technology, Sep. 23–27, 1990, Washington, D.C.

L. S. Pan, S. Han, D. R. Kania, S. Zhao, K. K. Gan, H. Kagan, R. Kass, R. Malchow, F. Morrow, W. F. Palmer, C. White, S. K. Kim, F. Sannes, S. Schnetzer, R. Stone, G. B. Thomson, Y. Sugimoto, A. Fry, S. Kanda, S. Olsen, M. Franklin, J. W. Ager III and P. Pianetta, "Particle–And Photo–Induced Conductivity in Type IIA Diamonds", Submitted to the Journal of Applied Physics, Jul. 15, 1993.

Y. Saito, K. Sato, H. Tanaka, K. Fujita and S. Matuda, "Diamond synthesis from methane–hydrogen–water mixed gas using a microwave plasma", Journal of Materials Science 23 (1988), pp. 842–846.

5,773,830

CVD DIAMOND RADIATION DETECTOR

This is a divisional of application Ser. No. 08/094,826 filed on Jul. 20, 1993, now abandoned.

The present invention was made with Government support, and the government has certain rights in the invention.

TECHNICAL FIELD

The invention relates generally to electronic radiation detectors and more particularly to detectors which make use of chemical vapor deposited diamond film.

BACKGROUND OF THE INVENTION

One type of solid state radiation detector has a strong electric field established between two electrodes within free-standing insulating material. When the insulating material is exposed to radiation of sufficient energy to bring electrons or electron-hole pair carriers into the conduction band, the carriers are swept to the electrodes by the electric field. Their arrival at the electrodes can be measured by an electronic signal detection device connected to the electrodes.

It has already been recognized that diamond in general is a particularly advantageous material for use in a solid state particle detector, especially for SSC (superconducting supercollider) particle physics research, because diamond is much more resistant to radiation damage than are alternative detector materials, such as silicon with a P-N junction. SSC accelerators produce an intense amount of radiation at their collision points. Silicon detectors suffer crystal structure defect damage in such an environment which leads to an increased leakage current and a decreased pulse height in their output signal. Furthermore, in silicon, the maximum field that can be applied before avalanche breakdown is about $10^3$ V/cm. This limits the charge velocity to approximately $10^6$ cm/s, so that the collection time is at least 20 ns (nanoseconds) for a detector with a thickness of a few hundred microns. However, such a long collection time can lead to difficulty in interpreting results from an SSC accelerator, since in such an accelerator the beam collisions occur on a timescale of less than 20 ns.

It has also already been recognized that CVD (chemically vapor deposited) diamond film is a particularly advantageous material for the detection of particle radiation. Diamond film of the CVD type can be made with lower impurity levels than natural diamond or diamond made by a high-temperature high-pressure process and can be readily provided in the wafer geometry preferred for particle detectors.

For making a CVD diamond detector, a free-standing CVD diamond film, typically several hundred microns thick, is metallized with a complementary electrode pattern on each of its faces. The dimensions of the electrode pattern will determine the spatial resolution of the detector. A voltage is applied between the electrodes, so that the electrons and holes will be accelerated to their respective, opposite polarity electrodes to produce a signal. In order to achieve an acceptable signal-to-noise ratio, it is necessary to avoid having the electrons and holes trapped by defects in the material. The collection distance "d" is the average distance that electrons and holes drift under the applied electric field before recombination at a trapping site. The collection distance d has also been found to be equal to the product of the carrier mobility, the carrier lifetime and the applied electric field. Early CVD diamond films had a collection distance of less than one micron, with both the mobility and lifetime being much lower than for natural IIa diamond. For a calorimeter-type particle detector, a minimum performance level is a collection distance of 25 microns, although 50 microns is considered most desirable. The highest value achieved thus far has been 15 microns with a mobility of 4000 $cm^2$ $V^{-1}$ $s^{-1}$ and a lifetime of 150 ps (picoseconds), both at an applied field of 200 Volts per centimeter. The lifetime may be limited by defects such as dislocations, stacking faults, impurities and twins. There is, therefore, a need for a diamond material which will permit the achievement of a greater collection distance d for particle detectors.

SUMMARY OF THE INVENTION

In accordance with the present invention, a novel CVD diamond film material which is made by a novel process exhibits greatly improved collection distance when used as a particle detector. The material is made by an arc jet process which includes a very low carbon source gas concentration, together with the addition of an oxidant source, such as water, to the process gases.

The CVD diamond material of the present invention exhibits a substantially improved collection distance for electrical carriers generated in it and is therefore an improved material for electronic purposes in general.

DETAILED DESCRIPTION

PROCESS

Figure 1:
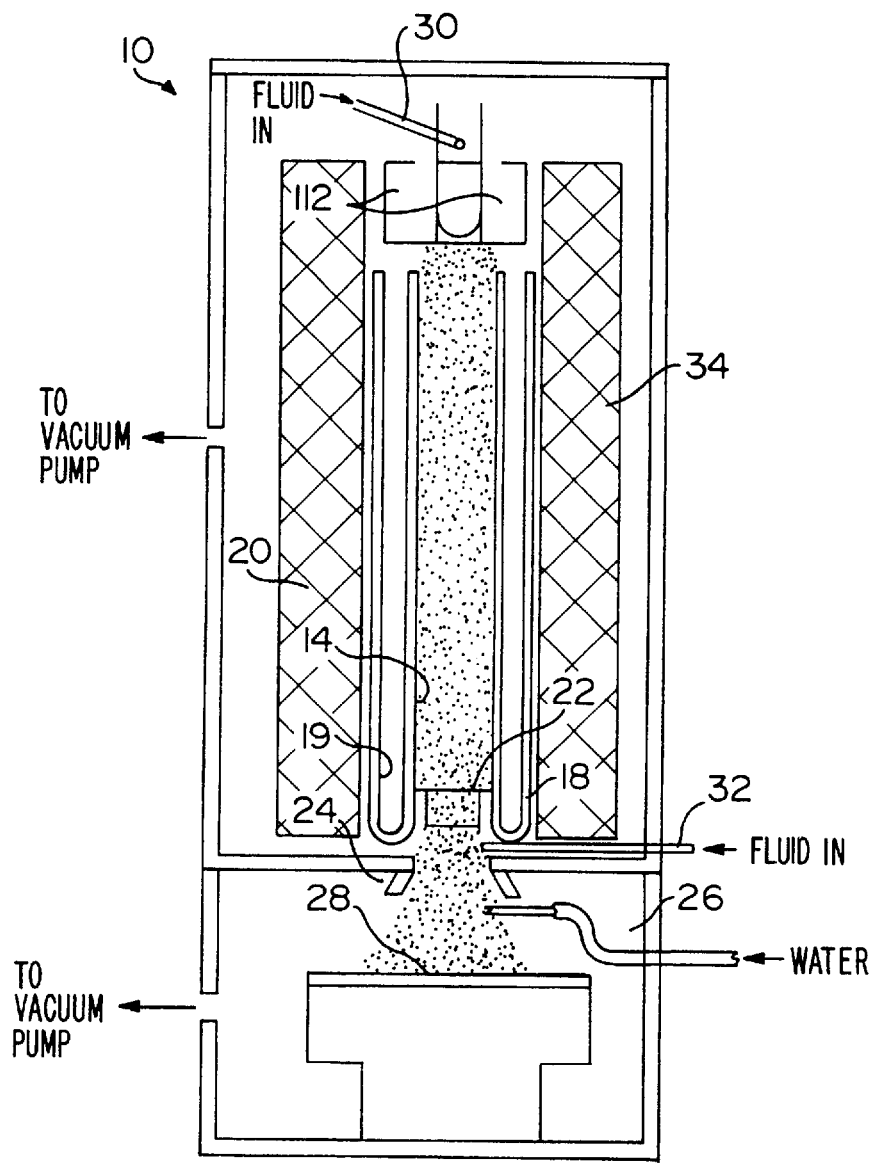
FIG. 1 is a schematic, sectioned, front view of a typical arc jet deposition apparatus known in the art which has been modified by the addition of water injection means for practicing the present method.

For description of a preferred embodiment of the process in accordance with the present invention, reference is made to the schematic representation of FIG. 1, which shows an arc jet apparatus 10. The apparatus 10 includes a cathode member 12 at the top end of a hollow barrel 14 in a metal jacket member 18 having an annular space 19 suitable for holding a fluid coolant. The barrel 14 and jacket member 18 are surrounded by a fluid-cooled magnetic coil assembly 20. Longitudinally spaced at the end of the barrel 14 opposite that of the cathode 12 is an anode member 22 having a central opening aligned with the axis of the barrel 14 and leading through a nozzle 24 into an evacuated deposition chamber 26 which has a cooled deposition substrate 28 spaced from the end of the nozzle 24. A gas injection means 30 is located to inject gas into the barrel 14. Other gas injection means 32 are located in the vicinity of the anode 22.

In the operation of the arc jet apparatus 10, hydrogen gas is injected through the injector tubes 30 and 32 at a predetermined rate. More hydrogen gas, mixed with methane, is injected through the tube 32. The concentration of methane is based on the total percentage of methane injected as a volume percent of the total gas injected through both tubes 30,32. A direct current arc is struck between the cathode 12 and anode 22. The enthalpy of the gas in the barrel is adjusted by control of the arc power to result in the desired temperature of the substrate 28, which is heated by the gas impinging from the nozzle 24. At this enthalpy, the hydrogen becomes partially dissociated hydrogen atoms. The magnetic coil assembly 20 around the barrel 14 generates a solenoidal magnetic field which has the effect of swirling the arc about the anode 22 to reduce anode erosion.

The activated gas mixture traveling through the nozzle 24 enters the evacuated deposition chamber 26 and impinges on a fluid-cooled deposition substrate 28 therein to form a diamond film on it. As the methane enters the activated gas through the tubes 32, it too becomes partially dissociated into unstable hydrocarbon radical species. A set of three aluminum oxide ceramic tubules 34 positioned in radial symmetry with their ends in the deposition zone between the nozzle 24 and the substrate 28 are fed with water by a peristaltic pump, not shown. At the substrate 28, the hydrogen acts as a facilitating gas for the deposition of the carbon atoms from the activated hydrocarbon radicals as diamond crystallites bonded to each other. The diamond crystallites consist of carbon atoms bonded chemically to each other by what is generally referred to as "sp3" bonds.

Apparatus of the arc jet type, such as the apparatus 10 described above, is known in the art, except for the water injection apparatus including the tubules 34. There are, of course variations is such apparatus and in the methods of operating it. Therefore, many other parameters are involved in the deposition process. However, it is submitted that the most important ones are generally the enthalpy (kilojoules/gram), vacuum level (torr), substrate temperature (degrees Celsius), methane concentration (percent), and water injection rate. Given these parameter values, the others can be determined for a given apparatus design and method of operation by the skilled operators familiar therewith without the necessity of undue experimentation. Such parameters do not lend themselves well to generalization, since they are dependent on specific apparatus design features.

The gases used must be highly pure with respect to certain elements. There should be an impurity level of less than 1,000 ppm (parts per million) for substances other than hydrogen, carbon, oxygen, argon, and helium. If the objective is to grow a free-standing diamond film, the deposition substrate is preferably molybdenum which has been coated with a thin layer about 3 microns (micro-meters) thick of titanium nitride, such as by vapor deposition, to reduce the adherence of the diamond to the substrate for better release of the film.

Diamond film samples were made on an apparatus essentially similar to the jet apparatus 10 described above. In each case, the arc power was between 20 and 40 kilowatts and the deposition rate was between 3 and 6 microns per hour. The temperature of the substrate is in degrees C (Celsius).

|  | Sample | | | | | |
| --- | --- | --- | --- | --- | --- | --- |
|  | A | B | C | D | E | F |
| deposition conditions | | | | | | |
| chamber press. (torr) | 12 | 12 | 12 | 12 | 12 | 12 |
| substrate temp. (°C.) | 825 | 844 | 825 | 933 | 850 | 840 |
| % methane | .050 | .052 | .076 | .050 | .072 | .050 |
| enthalpy (kJ/g) | 32.9 | 31.8 | 35.4 | 34.5 | 50.4 | 35.3 |
| power in kW | 29.6 | 28.6 | 31.8 | 31.2 | 31.6 | 31.8 |
| water in g/min. | 0 | 0 | 0 | 0 | 2 | 2 |
| O/C molar ratio | 0 | 0 | 0 | 0 | 7 | 7 |
| thickness (microns) | 308 | 400 | 383 | 357 | 410 | 300 |
| analysis of deposited samples | | | | | | |
| Raman FWHM (/cm) | — | 2.8 | 4.6 | 6.5 | — | 2.9 |
| thermal cond. (W/mK) | 1130 | — | 1230 | 1110 | 1430 | 1430 |
| collection distance (microns) | 3 | 4 | 3 | 2 | 45 | 41 |
| lattice constant (Angstroms) | — | 3.568 | 3.567 | 3.566 | 3.570 | 3.569 |

The substrate temperature is in degrees Celsius as measured by a pyrometer. The percent methane is the proportion by volume of the methane in the gas added through the tubes 30,32. The enthalpy is in kilojoules per gram. The power is the arc power in kilowatts. The water injection rate is in grams per minute. The O/C molar ratio is the molar ratio of oxygen to carbon in the deposition zone between the nozzle 24 and the substrate 28. The thickness is that of the diamond being deposited on the substrate 28. The Raman FWHM is in units of reciprocal centimeters and is the full width at half the maximum of the Raman scattering 1332/cm peak which is characteristic of diamond. The thermal conductivity was measured by the converging wave method. Such a method is described, for example, in "Measurement of thermal diffusivity of Polycrystalline Diamond Film by the Converging Thermal Wave Technique," by G. Lu and W. T. Swann in Appl. Phys. Letters 59 (13), Sep. 23, 1991. It is generally recognized that there can be substantial variations in thermal conductivity measurements from method to method. The collection distance was measured by a particle-induced conductivity technique of the type described in "Particle- And Photo-Induced Conductivity In Type IIA Diamonds" by L. S. Pan et al, *Journal of Applied Physics,* Jul. 15, 1993. The samples were not subjected to a radiation annealing process of the type sometimes referred to as "pumping" or "priming," which would significantly increase the collection distance. It is a drawback of the annealing process, however, that it tends to result in drifting of the baseline and is therefore troublesome in practical use. It is believed that the local collection distance of a given quality material is directly proportional to the distance from the surface of the diamond which was in contact with the substrate during deposition. We have therefore normalized all collection distances to a thickness of 400 microns. The lattice constants were measured by standard x-ray diffraction means. Polishing of the surface of the diamond which was in contact with the substrate during deposition can also produce an increase in the collection distance, but is a costly and difficult process because of the fragility and hardness of such thin diamond. It is an advantage of the diamond material in accordance with the present invention that it has a collection distance long enough to permit its use in a particle detector device without annealing or polishing.

MATERIAL

The results shown in the above table permit some observations with regard to characteristics of diamond material with a long collection distance. It is noted, for example, that Raman line width appears to be narrower for materials with increased collection distance. Also, there appears to be a correlation between a larger lattice constant and the collection distance, with a lattice constant of 3.569 or greater representing a dramatic increase in the collection distance. The thermal conductivity also appears to be improved for the samples E and F with the long collection distance.

The collection distances were measured with an electric field strength of 10 kilovolts per centimeter. In order for the diamond material to have a long carrier collection distance, it is essential that it be substantially free from most crystal lattice defects. Since the defects are microscopic, it is useful to assess their concentration by measuring certain characteristics of diamond which have been found to provide some indication of the degree to which defects are present. These characteristics are Raman line width and the thermal conductivity.

The results show that the specimens made with the added oxidant exhibit a much longer collection distance. Experience would also lead to a conclusion that samples E and F made with injected water are likely to contain less than 100 ppm (parts per million) of conductivity-enhancing impurities.

The Raman linewidth is the full line-width at half the maximum of the 1332/cm frequency Raman scattering spectrum line of diamond. This width gives an indication of the degree of ordering of the diamond. The analysis of the samples A–F show that diamond with larger Raman line widths has much reduced collection distances. The examples show that a narrow Raman line profile, while perhaps not alone a sufficient condition for determining that a material will exhibit a long collection distance, does appear to be associated with material having a long collection distance.

We have also noted that only samples with relatively high levels of thermal conductivity exhibit long collection distances, although high thermal conductivity does not by itself guarantee long collection distance.

While it has been previously suggested by others in the art that the addition of oxygen, such in the form of water, to a combustion, thermionic, or microwave CVD diamond manufacturing process would have a favorable effect on the quality of the resulting diamond material, the discovery of the present invention that the addition of oxygen, such as with water, to an arc jet process with very low methane would result in a material with a substantially improved charge carrier lifetime was not known before.

The diamond material in accordance with the present invention typically has a collection distance of 35–50 microns. The mobility is 3000–4000 $cm^2\ V^{-1}\ s^{-1}$ and the lifetime is over 1 ns. This increased lifetime is much higher than that previously reported as best in the literature for CVD diamond (150 ps) and is even higher than for natural IIa diamond (300–550 ps). The addition of water is seen to greatly improve the lifetime. Under identical conditions except for water, the diamond made without water had a lifetime of 120 ps while the diamond made with water had a lifetime of over 1 ns. Both had mobilities of 3000–4000 $cm^2\ V^{-1}\ s^{-1}$.

The collection distance is measured by applying a voltage to the electrodes on each side of the diamond and analyzing the signal after it has been amplified by a charge-sensitive preamplifier and by a signal shaping amplifier. The initial particles to be detected can be from a radioactive source (e.g. strontium 90) or from a particle accelerator beam line. The collection distance is determined from $$d = \frac{Q_{meas} t}{Q_{gen}}$$

where "$Q_{gen}$" is the amount of charge generated by the ionizing radiation. "$Q_{meas}$" is the measured charge and "t" is the diamond thickness. "$Q_{gen}$" is calculated by normalizing the diamond pulse height to the silicon pulse height (with corrections) or using a Monte Carlo simulation.

The mobility and lifetime are measured by UV transient photoconductivity. One mm wide electrodes are deposited on the same side of the diamond with a 1 mm gap between the electrodes. The gap is illuminated with 3 to 5 ps (picosecond) pulses from a 202 nm frequency-multiplied Nd-YAG (neodymium-yttrium aluminum garnet) laser. These pulses are typically up to 20 µJ/pulse at 10 Hz. The UV pulse creates electron-hole pairs and the subsequent current pulse is related to the carrier lifetime while the amplitude and total charge are related to the product of mobility and lifetime. In this test, only the top 2 microns at the surface is sampled due to the intrinsic absorption of UV light by diamond. In the particle-induced conductivity tests, the performance of the entire diamond thickness is sampled. Since the material on the substrate side is poorer and has small grain size, the particle-induced conductivity test gives a collection distance which is smaller than that deduced from the photoconductivity tests. The difference is typically a factor of two.

DEVICE

Figure 2:
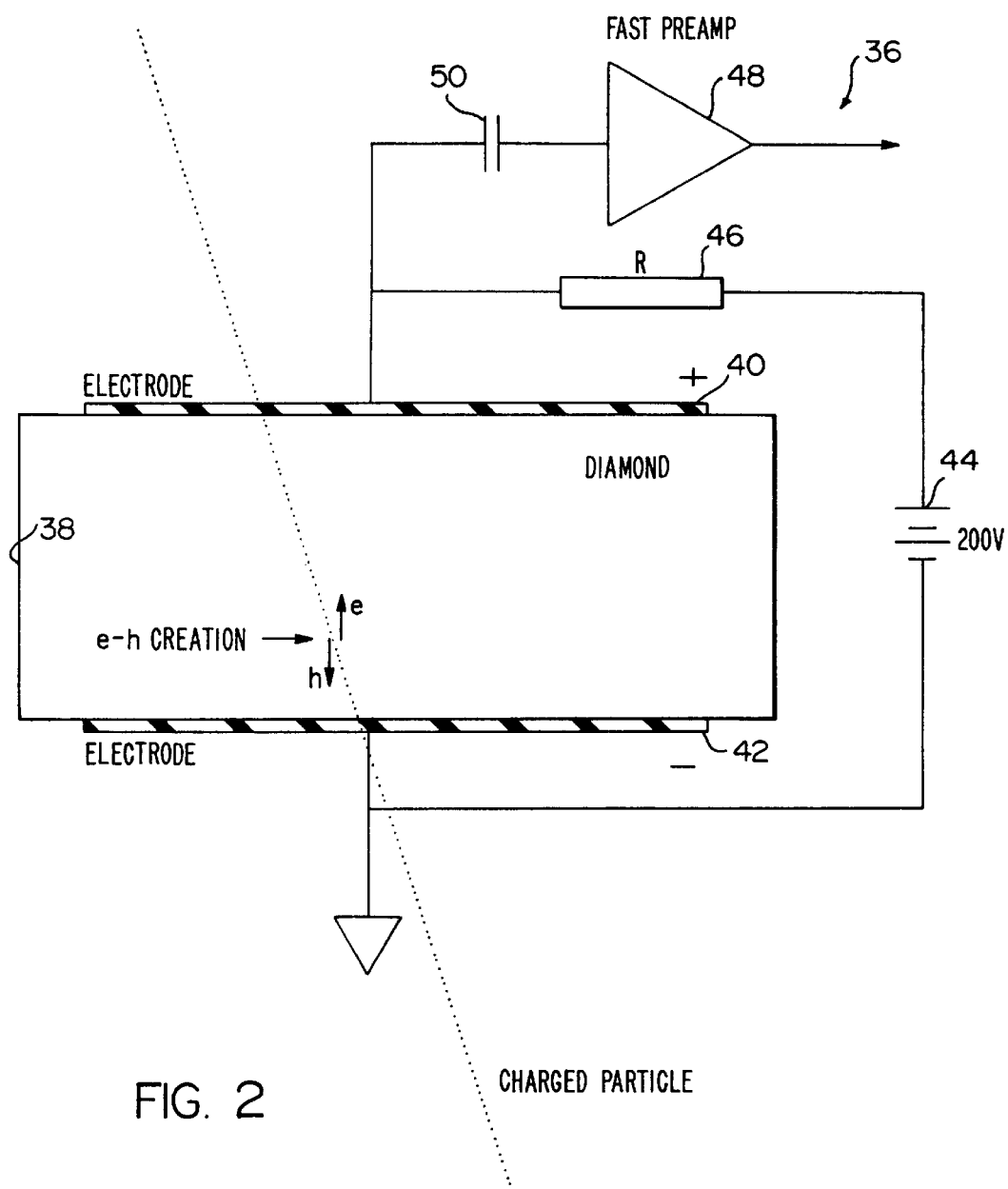
FIG. 2 is a schematic, cross-sectional view of a solid state particle detector device made with the diamond material of the present invention.

FIG. 2 of the drawings shows a particle detector 36 which features a wafer 38 of CVD diamond according to the present invention provided with two ohmic contact metal electrodes 40,42 on its faces. The electrodes 40,42 are connected to signal processing circuitry which includes a voltage source in series with a load resistor 46. An amplifier 48 is connected to the electrode 40 via an isolation capacitor 50. Electrodes could alternatively be in the form of interleaved comb-like structures which are both on the same face of the wafer. Such device structures are presently known in the art for use with diamond other than that of the present invention. The operation of the device is as described earlier in the discussion of such detector devices.

GENERAL CONSIDERATIONS

There is reason to assume that other oxidants, such as carbon dioxide, can be used in place of water for providing the oxidant used in the process. In addition, acetone, acetylene, and alcohols have been reported as substitutes for methane as the carbon source gas which would also contribute oxygen to the mix. These are expected to give similar results to methane with water if the concentrations are adjusted appropriately: generally each atom of oxygen bonds firmly to one carbon atom, so that a molecule such as acetone (CH3COCH3) contributes about as much free carbonaceous species as two molecules of methane (CH4). The term "oxidant" herein is used to denote substances traditionally considered in this class in the chemical arts. Tightly bonded molecules such as acetylene are less effective in producing diamond than are molecules like methane. However, if the residence time of the acetylene molecule is long enough, it may convert partially to more active species such as methane in flight. If the acetylene (or any other molecule) is injected into the arc, then it is substantially broken up and should count as if the carbon were present as methane (unless oxygen is present). Thus, it would be expected that one could obtain results similar to those described above in accordance with the invention by the use of carbon source gas other than methane which includes one or more oxygen atoms and is present in a concentration equivalent to that of the methane concentration disclosed herein in terms of the resulting active species. Sulfur and the halogens fluorine and chlorine could also be expected to improve the collection distance by oxidizing impurities and attacking structural defects much as oxygen appears to do in the deposition process. Therefore, the invention is not intended to be limited to the use of methane alone as the carbon source gas or water alone as the oxidant source. However, water is a particularly advantageous oxidant source from the standpoint of convenience, cost, and safety considerations.

Similarly, while here the facilitating gas is hydrogen, it has been shown by those skilled in the art that there may be other gases used to facilitate the growth of diamond films.

What is claimed is:

1. A polycrystalline CVD diamond particle detector device, comprising:

a wafer of chemically vapor deposited diamond exhibiting a collection distance of at least 25 microns and electrode means in electrical contact with the wafer and adapted to generate an electric field in the wafer when provided with a biasing voltage.

2. The device according to claim 1, wherein the wafer is of diamond having a Raman full width at the half maximum of the 1332 per centimeter Raman scattering peak of less than about 5 per centimeter.

3. The device according to claim 2 in which the diamond exhibits a collection distance of at least 35 microns.

4. The device according to claim 1 wherein the diamond wafer is unannealed.

5. The device according to claim 1 wherein the diamond wafer is unpolished.

6. The device according to claim 5 wherein the diamond wafer is unannealed.

* * * * *